(12) United States Patent
Park et al.

(10) Patent No.: US 8,184,680 B2
(45) Date of Patent: May 22, 2012

(54) DATA TRANSCEIVER SYSTEM AND ASSOCIATED METHODS

(75) Inventors: Hwan-Wook Park, Yongin-si (KR); Young-Chan Jang, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 633 days.

(21) Appl. No.: 12/379,080

(22) Filed: Feb. 12, 2009

(65) Prior Publication Data

US 2009/0207895 A1    Aug. 20, 2009

(30) Foreign Application Priority Data

Feb. 15, 2008    (KR) .................. 10-2008-0013909

(51) Int. Cl.
*H04B 1/38*    (2006.01)

(52) U.S. Cl. ....................................... 375/219

(58) Field of Classification Search .............. 375/219, 375/260, 285, 346
See application file for complete search history.

(56) References Cited

U.S. PATENT DOCUMENTS

| 6,567,092 | B1 | 5/2003 | Bowen |
| 7,042,265 | B2 * | 5/2006 | Harrison ...................... 327/271 |
| 2007/0156993 | A1 | 7/2007 | Alexander et al. |
| 2010/0039875 | A1 * | 2/2010 | Stott et al. ...................... 365/193 |
| 2010/0073047 | A1 * | 3/2010 | Best et al. ...................... 327/156 |

FOREIGN PATENT DOCUMENTS

JP    02-177783 A    7/1990

* cited by examiner

*Primary Examiner* — Don N Vo
(74) *Attorney, Agent, or Firm* — Lee & Morse, P.C.

(57) ABSTRACT

A data transceiver system may include an error corrector. The error corrector may include a plurality of delay units, each delay unit being configured to delay a corresponding data signal among a plurality of data signals by a time in response to a corresponding delay code among a plurality of delay codes and outputting the delayed data signal, an error detector configured to receive the plurality of delay codes, determine whether an error has occurred, and output an error signal according to the determination in a data frame lock operation, and a delay controller configured to set initial values of the plurality of delay codes to a predetermined value, vary and output each of the plurality of delay codes in response to a lock signal, and reset initial values the plurality of delay codes in response to the error signal in the data frame lock operation.

20 Claims, 8 Drawing Sheets

DATA TRANSCEIVER SYSTEM AND ASSOCIATED METHODS

BACKGROUND

1. Field

Example embodiments relate to a data transceiver system. More particularly, example embodiments relate to a data transceiver system that can sense and correct an error occurring in a data frame lock process.

2. Description of the Related Art

Semiconductor systems use parallel data interfaces for a data transceiver system between semiconductor devices, for example, a double data rate (DDR) semiconductor memory device and a memory controller. In general, such a data transceiver system uses a common input/output (I/O) port through which data is input/output. A maximum delay time and a phase relation (skew) between signals (data, clock signals, etc.) transmitted through the data transceiver system may be defined in a specification or a standard.

Data transceiver systems of next-generation semiconductor memory devices directly use parallel data interfaces. To support high-speed operation and improve channel efficiency, separate I/O ports are applied. To increase mounting density, multi-chip package (MCP) techniques, etc., may also be employed. However, such separate I/O ports makes defining a phase relation between signals more difficult than when the common I/O port is used. In particular, an error may occur in a data frame lock process that may not be detected.

SUMMARY

Example embodiments are therefore directed to a data transceiver system, and associated methods, which substantially overcome one or more of the problems of the related art.

It is therefore a feature of an embodiment to provide a data transceiver system, and associated methods that can sense and correct an error occurring in a data frame lock process.

At least one of the above and other features and advantages may be realized by providing a data transceiver system, including a data transmitter configured to output a reference clock signal and a plurality of data signals, and a data receiver configured to receive the reference clock signal and the plurality of data signals, determine whether a data frame has been locked, and output a lock signal according to the determination in a data frame lock operation, wherein one of the data transmitter and the data receiver comprises a plurality of delay units, each delay unit configured to delay a corresponding data signal among the plurality of data signals by a time in response to a corresponding delay code among a plurality of delay codes and to output the delayed data signal, an error detector configured to receive the plurality of delay codes, determine whether an error has occurred, and output an error signal according to the determination in the data frame lock operation, and a delay controller configured to set initial values of the plurality of delay codes to a predetermined value, vary and output each of the plurality of delay codes in response to the lock signal, and vary and output at least one of the plurality of delay codes in response to the error signal in the data frame lock operation.

The data transmitter may output the plurality of data signals in the data frame.

The error detector may include a subtraction unit configured to calculate and output difference values between the plurality of delay codes, a comparison unit configured to output comparison results by comparing each of the difference values with a predetermined reference value, and an error signal generator configured to receive the comparison results and output the error signal.

The data transmitter may be configured to output a selection signal in response to the lock signal.

The data receiver may include a reception controller configured to receive the reference clock signal and output a frame clock signal in the data frame lock operation, a plurality of input drivers, each input driver configured to receive a corresponding delayed data signal among the plurality of delayed data signals in response to the frame clock signal and outputting an input data signal, a selector configured to select one of the input data signals in response to the selection signal and output the selected data signal, and a lock signal generator configured to receive the selected data signal, determine whether a data frame has been locked, and output the lock signal.

The data receiver includes a reception controller configured to receive the reference clock signal and output a frame clock signal in the data frame lock operation, a plurality of input drivers, each input driver configured to receive a corresponding data signal among the plurality of data signals in response to the frame clock signal and outputting an input data signal to the corresponding delay unit among the plurality of delay units, a selector configured to select one of the delayed data signals in response to the selection signal and output the selected data signal, and a lock signal generator configured to receive the selected data signal, determine whether a data frame has been locked, and output the lock signal.

The delay controller may include a counter configured to vary and output a code on the basis of an initial value until the lock signal is activated, a plurality of registers, each register configured to receive and store the code as one of the plurality of delay codes and to output the stored delay code, a register selector configured to output the code to one of the plurality of registers in response to the selection signal, and a setting unit configured to set an initial value of the counter to the predetermined value in response to the lock signal and set the initial value of the counter to the value that is different from the predetermined value in response to the error signal and the lock signal in the data frame lock operation.

The delay controller may include a count clock generator configured to receive the reference clock signal and generate a count clock signal, and the counter varies the code in response to the count clock signal.

The delay controller may include a counter configured to vary and output a code on the basis of an initial value until the lock signal is activated, a plurality of registers, each register configured to receive and store the code as one of the plurality of delay codes and to output the stored delay code, a register selector configured to output the code to one of the plurality of registers in response to the selection signal, and a setting unit configured to set an initial value of the counter to the predetermined value in response to the lock signal and decrement only a delay code stored in a register storing a largest delay code value among the plurality of registers, by a predetermined value, in response to the error signal in the data frame lock operation.

The setting unit may be configured to receive the comparison results output from the comparison unit of the error detector and detect the register storing the largest delay code value.

The setting unit may be configured to receive the difference values output from the subtraction unit of the error detector and detect the register storing the largest delay code value.

The setting unit may be configured to receive the plurality of delay codes stored in the plurality of registers and detect the register storing the largest delay code value.

The data transmitter may be a memory controller and the data receiver may be a semiconductor memory device.

The delay controller may include a counter configured to vary and output a code on the basis of an initial value until the lock signal is activated, a plurality of registers, each register configured to receive and store the code as one of the plurality of delay codes and to output the stored delay code, a register selector configured to output the code to one of the plurality of registers in response to the selection signal, and a setting unit configured to set an initial value of the counter to the predetermined value in response to the lock signal in the data frame lock operation, and wherein the frame clock signal is advanced by a predetermined time in response to the error signal.

At least one of the above and other features and embodiments may be realized by providing a method of correcting an error in transmission and reception of a plurality of data signals, the method including setting initial values of a plurality of delay codes to a predetermined value, varying and outputting each of the plurality of delay codes based on the initial value in response to a lock signal, delaying a corresponding data signal among the plurality of data signals by a time in response to a corresponding delay code among the plurality of delay codes and outputting the delayed data signal, determining from the plurality of delay codes whether an error has occurred and outputting an error signal according to the determination in a data frame lock operation, and resetting at least one of the plurality of delay codes in response to the error signal in the data frame lock operation.

The determining whether an error has occurred and outputting an error signal may include calculating and outputting difference values between the plurality of delay codes, outputting comparison results by comparing each of the difference values with a predetermined reference value, and receiving the comparison results and outputting the error signal.

The resetting at least one of the plurality of delay codes may include setting the initial value of the plurality of delay codes to the value that is different from the predetermined value in response to the error signal and the lock signal in the data frame lock operation, and varying and outputting each of the plurality of delay codes based on the initial value that is different from the predetermined value in response to a lock signal.

The resetting at least one of the plurality of delay codes may include decrementing only a largest delay code among the plurality of varied delay codes, by a predetermined value, in response to the error signal in the data frame lock operation.

The method may further include receiving the plurality of data signals in response to a frame clock signal, and the resetting at least one of the plurality of delay codes may include advancing the frame clock signal by a predetermined time in response to the error signal, and varying and outputting again each of the plurality of delay codes based on the initial value in response to a lock signal.

BRIEF DESCRIPTION OF THE DRAWINGS

The above and other features and advantages will become more apparent to those of ordinary skill in the art by describing in detail exemplary embodiments thereof with reference to the attached drawings, in which.

DETAILED DESCRIPTION

Korean Patent Application No. 10-2008-0013909, filed on Feb. 15, 2008, in the Korean Intellectual Property Office, and entitled: "Data Transceiver System," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
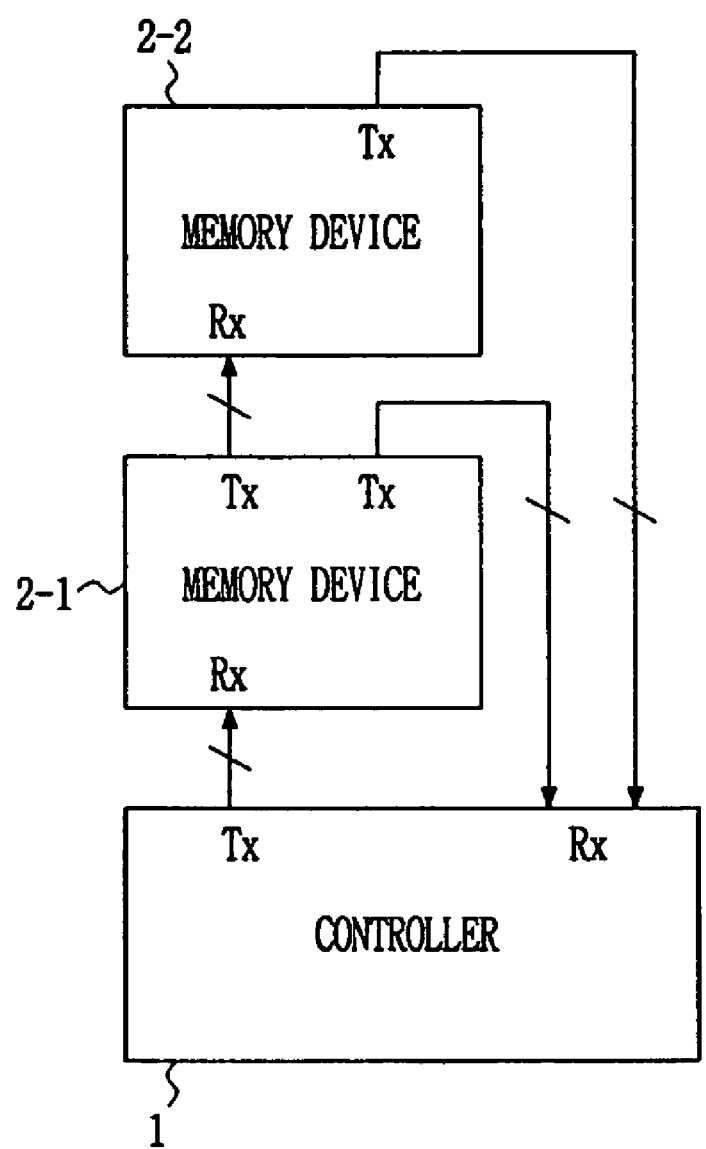
FIG. 1 illustrates a block diagram of a configuration of a semiconductor memory system to which separate I/O ports and a MCP are applied.

FIG. 1 illustrates a block diagram of a semiconductor memory system to which separate I/O ports and a MCP are applied. The semiconductor memory system may include a controller 1 and memory devices 2-1 and 2-2. Tx denotes an output port and Rx denotes an input port.

The controller 1 may output a clock signal, a command, an address, and write data to the memory devices 2-1 and 2-2 via the output port Tx. The controller 1 may receive read data, etc. from the memory devices 2-1 and 2-2 via the input port Rx. In general, the command, the address, and the write data output from the controller 1 are configured in one data frame. That is, one data frame may include a command and an address or a command, an address, and write data. One data frame indicates one unit for performing a predetermined operation, e.g., a data write operation.

Each of the memory devices 2-1 and 2-2 may receive data and a command signal from the controller 1 via the input port Rx. Each of the memory devices 2-1 and 2-2 may store the data input via the input port Rx in response to the command signal and/or may output stored data to the controller 1 via the output port Tx.

In other words, in the semiconductor memory system shown in FIG. 1, the output port Tx and input port Rx of the controller 1 and the memory devices 2-1 and 2-2 are separate. However, the semiconductor memory system having separate I/O ports shown in FIG. 1 may not detect a delay time of a received signal, particularly, a delay time when a signal output from the controller 1 is input to the memory device 2-2. Thus, use of separate I/O ports makes defining a phase relation between signals more difficult than when the common I/O port is used. Accordingly, a data frame/bit lock process is needed.

Figure 2:
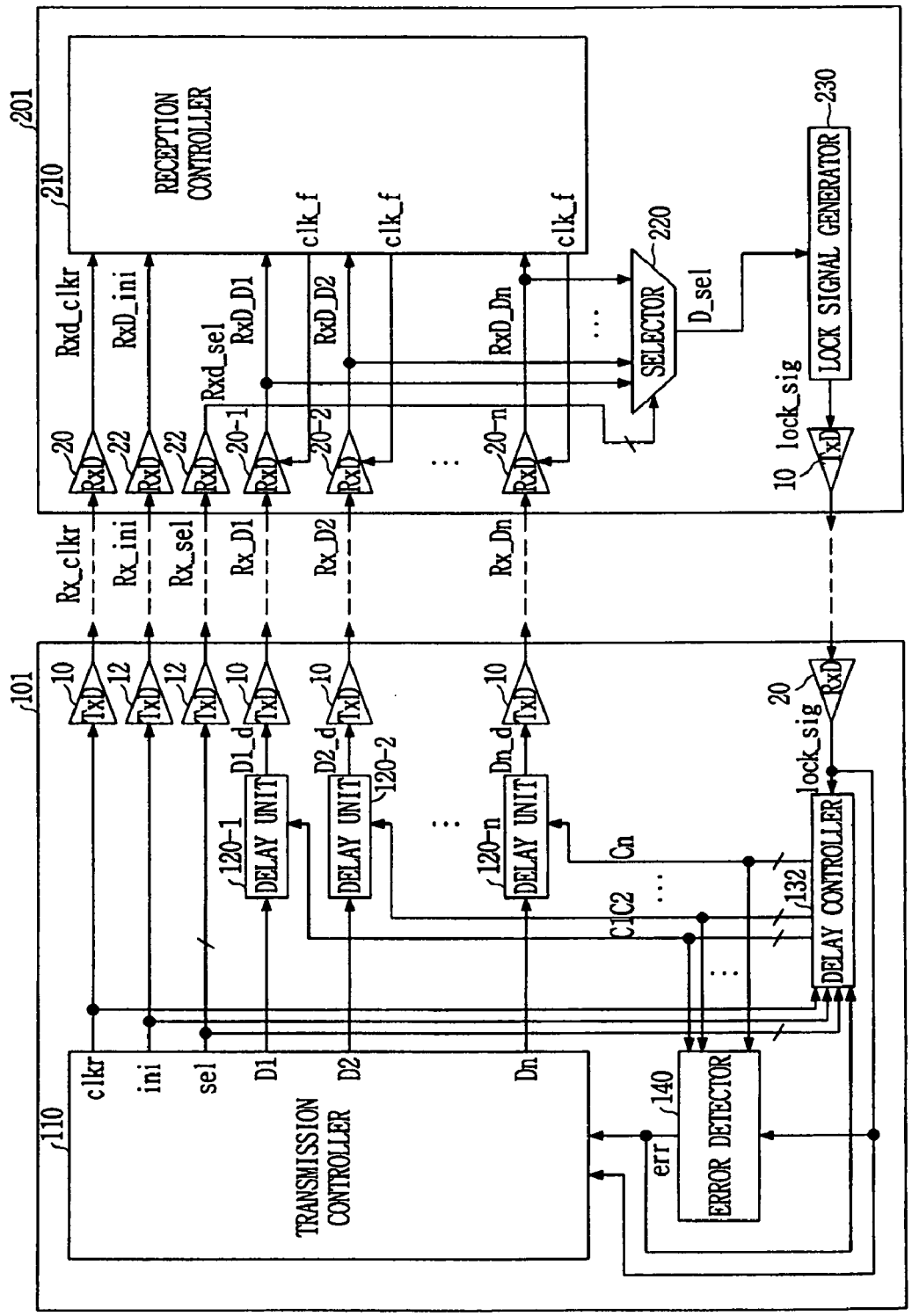
FIG. 2 illustrates a block diagram of a configuration of a data transceiver system according to example embodiments.

FIG. 2 illustrates a block diagram of a data transceiver system according to example embodiments. The data transceiver system may include a data transmitter 101 and a data receiver 201. The data transmitter 101 may include a transmission controller 110, a plurality of delay units 120-1~120-n, a delay controller 132, an error detector 140, a plurality of output drivers 10 and 12, and an input driver 20. The data receiver 201 may include a reception controller 210, a selector 220, a lock signal generator 230, a plurality of input drivers 20, 20-1~20-n, and 22, and an output driver 10. The plurality of delay units 120-1~120-n, the delay controller 132, and the error detector 140 may form an error corrector.

Each of the output drivers 10 may drive a signal generated inside the data transmitter 100 or the data receiver 200 and may output the signal to an external device. Each of the input drivers 20 may drive a signal input from an external device and may output the signal to the data transmitter 100 or the data receiver 200. Each of the input drivers 20-1~20-n may drive corresponding reception data signals Rx_D1~Rx_Dn and may output input data signals Rxd_D1~Rxd_Dn in response to frame clock signals clk_f. In general, an initialization signal ini and a selection signal sel have a lower frequency than other signals. The output drivers 12 may respectively receive the initialization signal ini and the selection signal sel, and may output a reception initialization signal Rx_ini and a reception selection signal Rx_sel. The input drivers 22 may respectively receive the reception initialization signal Rx_ini and the reception selection signal Rx_sel input from the external device, and may output an input initialization signal Rxd_ini and an input selection signal Rxd_sel to the reception controller 210.

The data transmitter 101 may drive and output a reference clock signal clkr, the initialization signal ini, the selection signal sel, and delayed data signals D1_d~Dn_d via the corresponding output drivers 10 and 12 to the data receiver 201. The data transmitter 101 may receive a lock signal lock_sig output from the data receiver 201 via the input driver 20.

The transmission controller 110 may output the reference clock signal clkr, the initialization signal ini, the selection signal sel, and data signals D1~Dn. In other words, the transmission controller 110 may output the data signals D1~Dn in one data frame in a normal operation, activate the initialization signal ini in a data frame lock operation, output the data signals D1~Dn having a predetermined pattern in synchronization with the reference clock signal clkr, and output the selection signal sel in response to the lock signal lock_sig. Each of the data signals D1~Dn may be a multi-bit serial signal. The initialization signal ini may be activated in an initialization operation including the data frame lock operation, etc.

In response to delay codes C1~Cn, the delay units 10-1~10-n may output the delayed data signals D1_d~Dn_d by delaying the input data signals D1~Dn by a given time. Thus, delay times of the delay units 10-1~10-n may differ according to the delay codes C1~Cn.

The delay controller 132 may set initial values of a plurality of delay codes C1~Cn in response to an initialization signal ini, varies and may output the delay codes C1~Cn in response to a lock signal lock_sig. The delay controller 132 may reset the delay codes C1~Cn in response to an error signal err output from the error determiner 140 in a data frame lock operation. When the delay codes C1~Cn are varied, they may be sequentially varied using a reference clock signal clkr output from the transmission controller 110. Although not shown, the delay controller 132 may include a register, a counter, a demultiplexer, etc.

The error detector 140 may receive the delay codes C1~Cn, determine whether an error has occurred, and output the error signal err according to the determination in the data frame lock operation. The error detector 140 may be configured to operate in response to the lock signal lock_sig. For example, when the lock signal lock_sig is activated n times, i.e., only when the data frame lock process ends, the error detector 140 may be configured to operate for a given time. In this case, power consumption by the error detector 140 may be minimized. After the initialization operation including the data frame lock process ends, the data transmitter 101 may have no influence.

The data receiver 201 may receive a reception reference clock signal Rx_clkr, the reception selection signal Rx_sel, and the reception initialization signal Rx_ini via the input drivers 20 and 22, may receive the reception data signals Rx_D1~Rx_Dn via the input drivers 20-1~20-n, and may output the lock signal lock_sig via the output driver 10.

In response to an input reference clock signal Rxd_clkr driven by the input driver 20 and the input initialization signal Rxd_ini driven by the input driver 22, the reception controller 210 may output the frame clock signals clk_f.

In response to the input selection signal Rxd_sel, the selector 220 may select one of the input data signals Rxd_D1~Rxd_Dn driven by the input drivers 10 and may output the selected data signal D_sel.

The lock signal generator 230 may output the lock signal lock_sig using the selected data signal D_sel output from the selector 220. For example, the lock signal generator 230 may be configured with a plurality of determination circuits (voters), etc. In this case, the lock signal generator 230 may receive selected data signals D_sel continuously for a given time, may output a high-level lock signal lock_sig when a large number of selected data signals D_sel have a high level, and may output a low-level lock signal lock_sig when a large number of selected data signals D_sel have a low level.

Each of the data transmitter 101 and the data receiver 201 of the data transceiver system shown in FIG. 2 may be configured with a semiconductor memory device. The data transceiver system shown in FIG. 2 may be applied to the semiconductor memory system including a memory controller and at least one memory device. In this case, the data transmitter 101 may correspond to a memory controller and the data receiver 201 may correspond to a semiconductor memory device, and the data transmitter 101 (i.e. memory controller) may additionally output an address signal, a command signal such as a read/write signal, and a data signal, and, the data receiver 201 (i.e. semiconductor memory device) stores data output from the data transmitter 101 in response to the address signal and the read/write signal. Also, when the data transceiver system shown in FIG. 2 is applied to the semiconductor memory system, the data transmitter 101 of memory controller may additionally output an address signal, a command signal, e.g., a read/write signal, and a data signal. In response to the address signal, the read/write signal, and/or data signals input via the data receiver 201 of the memory device, the memory device may store data output from the data transmitter 101 of the memory controller and/or output data stored in the memory device to the data receiver 201 of the memory controller via the data transmitter 101 of the memory device.

Although not shown in FIG. 2, the error signal err output from the error determiner 140 may be output via the output driver and input to the reception controller 210 via the input driver and the data frame lock process may be repeated by delaying or advancing the frame clock signal clk_f by a predetermined time in the reception controller 210 when an error has occurred in the data frame lock process.

Figure 3:
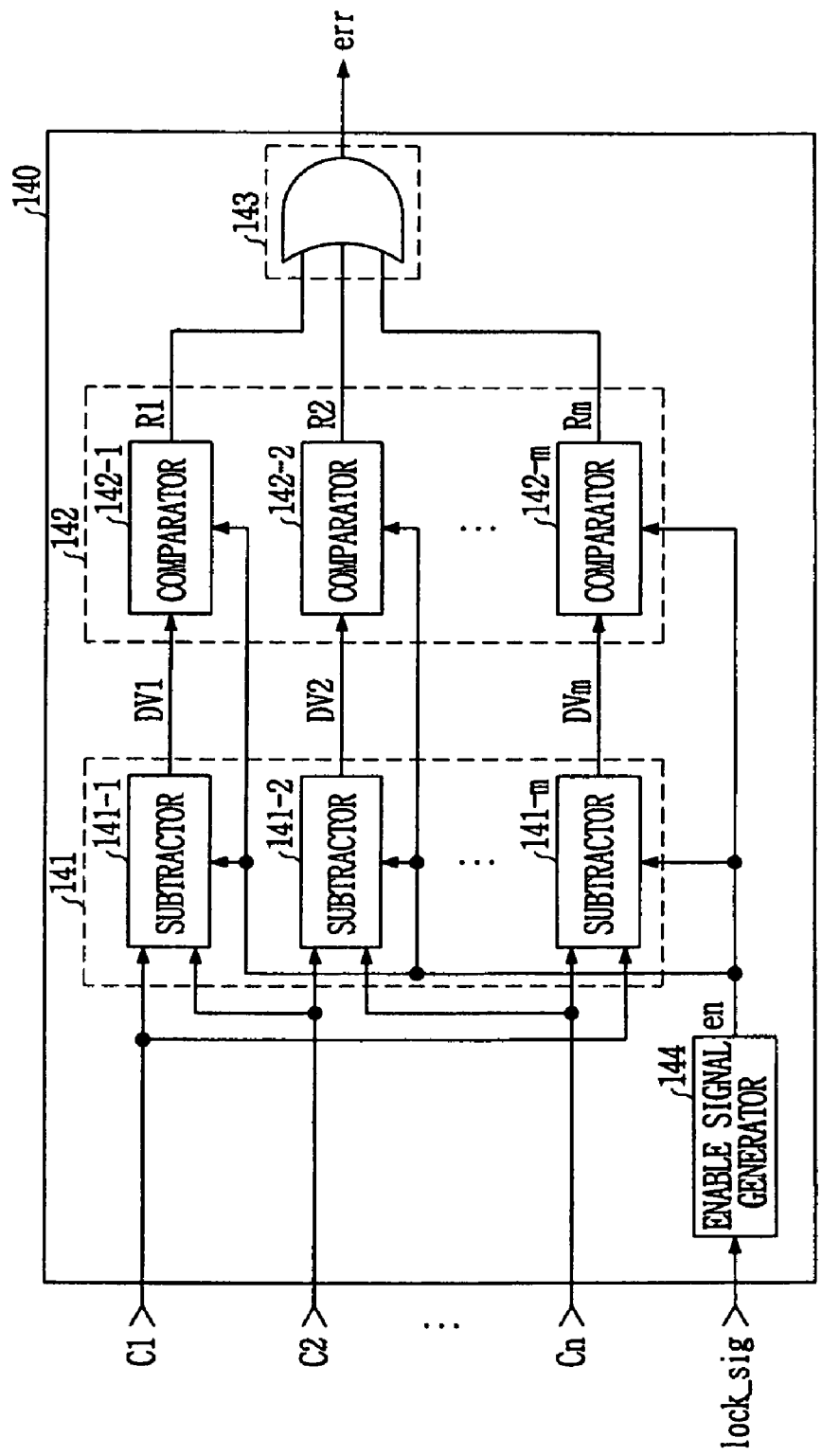
FIG. 3 illustrates a block diagram of a configuration of an error determiner of the data transceiver system shown in FIG. 4 according to example embodiments.

FIG. 3 illustrates a block diagram of the error detector 140 of the data transmitter 101 of the data transceiver system shown in FIG. 2 according to example embodiments. The error detector 140 may include a subtraction unit 141 having a plurality of subtractors 141-1~141-m, a comparison unit 142 having a plurality of comparators 142-1~142-m, an error signal generator 143, and an enable signal generator 144.

The subtraction unit 141 may receive the delay codes C1~Cn and may calculate and output difference values DV1~DVm between the delay codes C1~Cn. In other words, in response to an enable signal en, each of the subtractors 141-1~141-m may calculate a difference value between input delay codes. If needed, each of the subtractors 141-1~141-m may be configured to output a signed difference value between the input delay codes.

The comparison unit 142 may output comparison results R1~Rm by comparing the difference values DV1~DVm with a predetermined reference value. Thus, in response to the enable signal en, each of the comparators 142-1~142-m may compare an input difference value with the predetermined reference value. When the difference value is smaller than the reference value, a logic value "0" may be output as the comparison result. When the difference value is larger than the reference value, a logic value "1" may be output as the comparison result. If needed, each of the comparators 142-1~142-m may be configured to output a signed comparison result. For example, when each of the subtractors 141-1~141-m outputs a signed difference value, each of the comparators 142-1~142-m may output a comparison result having the logic value "0" if an absolute value of the difference value is smaller than the reference value, output a comparison result having the logic value "1" if the absolute value of the difference value is larger than the reference value and the difference value is positive, and output a comparison result having the logic value "−1" if the absolute value of the difference value is larger than the reference value and the difference value is negative.

In response to comparison result signals, the error signal generator 143 may output an error signal err. The error signal generator 143 may be configured with an OR gate. In this case, when all comparison results R1~Rm are "0", a low-level error signal err may be output. When any one of the comparison results R1~Rm is "1", a high-level error signal err may be output.

In response to the lock signal lock_sig, the enable signal generator 144 may output the enable signal en. For example, the enable signal generator 144 may be configured with a counter, etc. When the lock signal lock_sig is activated n times, the enable signal generator 144 may be configured to generate the enable signal en.

According to example embodiments, when all difference values calculated between the delay codes C1~Cn are smaller than a predetermined reference value, the error detector 140 of the data transceiver system shown in FIG. 2 may deactivate the error signal err by determining that no error has occurred in the data frame lock process. When any one of the difference values is larger than the predetermined reference value, the error detector 140 may activate the error signal err by determining that an error has occurred in the data lock process. The reference value may vary with the number of data bits within one frame and may be determined according to characteristics of a particular data transceiver system.

Figure 4:
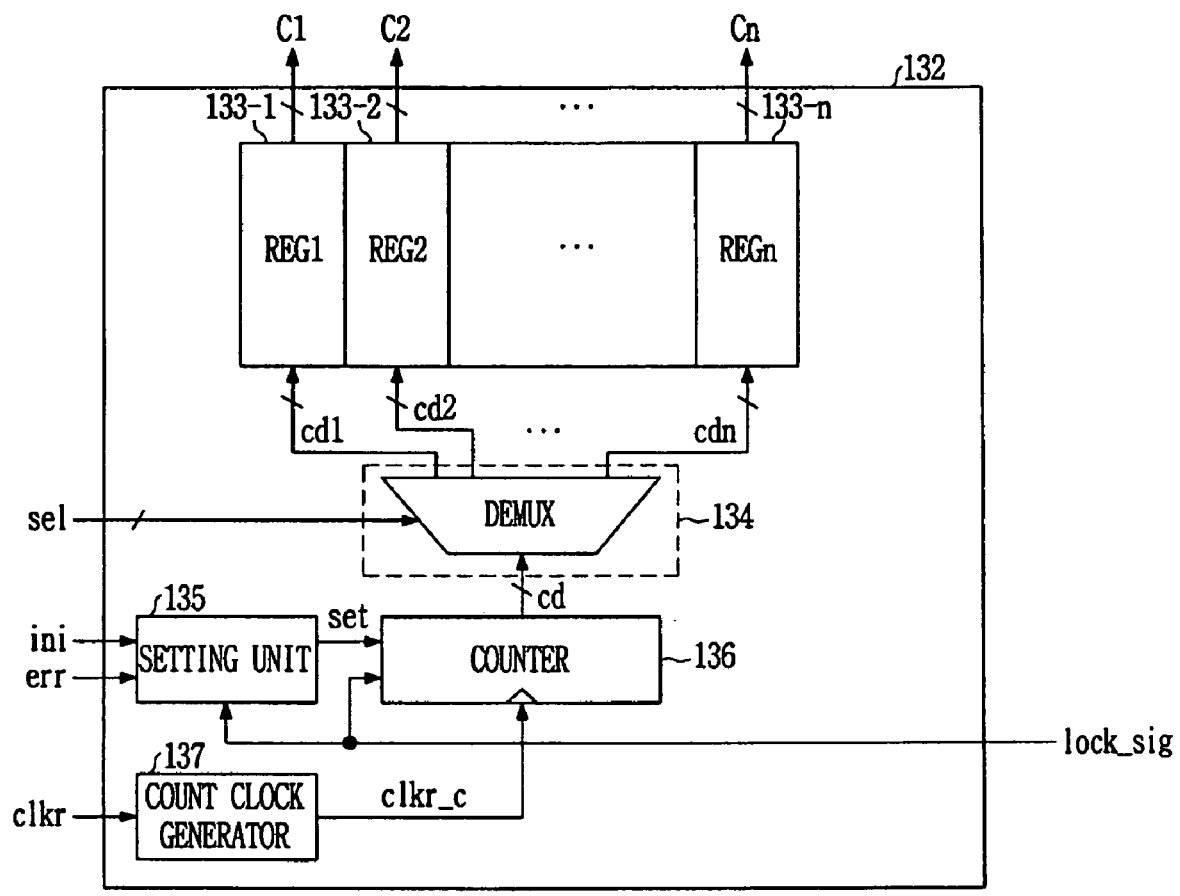
FIG. 4 illustrates a block diagram of a configuration of a delay controller of the data transceiver system shown in FIG. 4 according to example embodiments.

FIG. 4 illustrates a block diagram of the delay controller 132 of the data transmitter 101 of the data transceiver system shown in FIG. 2 according to example embodiments. The delay controller 132 may includes a plurality of registers 133-1~133-n, a register selector 134, a setting unit 135, a counter 136, and a count clock generator 137.

The setting unit 135 may set an initial value set of the counter 136 in response to the lock signal lock_sig, and may reset the initial value set of the counter 136 in response to the error signal err and the lock signal lock_sig in the data frame lock operation. In other words, in the data frame lock operation, the setting unit 135 may set the initial value of the counter 136 to a predetermined value when the initialization signal ini is activated and may set the initial value of the counter 136 to the predetermined value when the lock signal lock_sig is activated. When the error signal err is activated, the setting unit 135 may reset the initial value of the counter 136 to a value that is different from the predetermined value. When the lock signal lock_sig is activated, the initial value of the counter 136 may be set to the value that is different from the predetermined value by the setting unit 135.

In response to the lock signal lock_sig, the counter 136 may vary and output a code cd on the basis of the initial value. The counter 136 may be configured to vary and output the code cd in response to a count clock signal clk_c. For example, the code cd may be varied and output in response to the count clock signal clk_c until the lock signal lock_sig is activated on the basis of the set or reset initial value set.

In response to the reference clock signal clkr, the counter clock generator 137 may output the count clock signal clk_c. A period of the count clock signal clk_c may be determined by a time in which the lock signal generator 230 continuously receives selected data signals D_sel.

In response to the selection signal sel, the register selector 134 may output the code cd input from the counter 136 to one of the registers 133-1~133-n. The registers 133-1~133-n may respectively store the corresponding codes cd1~cdn and output the delay codes C1~Cn. Although not shown, the setting unit 135 may be configured to decrement only a delay code stored in a register storing a largest delay code value among the registers 133-1~133-n, by a predetermined value, in response to the error signal err.

According to example embodiments, operation of the delay controller 132 shown in FIG. 4 will be described as follows.

When the initialization signal ini is activated in the data frame lock operation, the setting unit 135 sets an initial value of the counter 136 to a predetermined value. That is, the setting unit 135 sets an initial value of the code cd. Until the lock signal lock_sig is activated, the counter 136 may increment or decrement the code cd from the initial value in response to the count clock signal clk_c. In response to the selection signal sel output from the transmission controller 110, the register selector 134 may output the code cd input from the counter 136 to the register 133-1. When the lock signal lock_sig is activated, the code cd may be stored in the register 133-1.

When the lock signal lock_sig is activated, the setting unit 135 may set the initial value of the code cd to be output from the counter 136 to the predetermined value. The transmission controller 110 may output the selection signal set such that the code cd output from the counter 136 is input to the register 133-2. By repeating the above process, the delay codes C1~Cn may be respectively stored in all the registers 133-1~133-n. When the error signal err is not activated, the data frame lock process may end. When the error signal err is activated, the setting unit 135 may reset the initial value of the code cd to be output from the counter 136 to a value that is different from the predetermined value and repeat the above process.

When the error signal err is activated as described above, the setting unit 135 may be configured to detect a delay code having the largest value among the delay codes C1~Cn, decrement only the detected delay code by a predetermined value, and terminate the data frame lock process. In this case, the setting unit 135 may be configured to detect the delay code having the largest value by additionally receiving and analyzing the comparison results R1~Rm or the difference values DV1~DVm (including signs) from the error detector 140 shown in FIG. 3 or by receiving the delay codes C1~Cn stored in the registers 133-1~133-n, and to change and store only a value of a register storing the delay code such that a reception data signal may be delayed by one frame. For example, if a delay code having a largest variation is C2, a value stored in the register 133-2 may be changed to delay only the reception data signal Rx_D2 by one frame.

Figure 5:
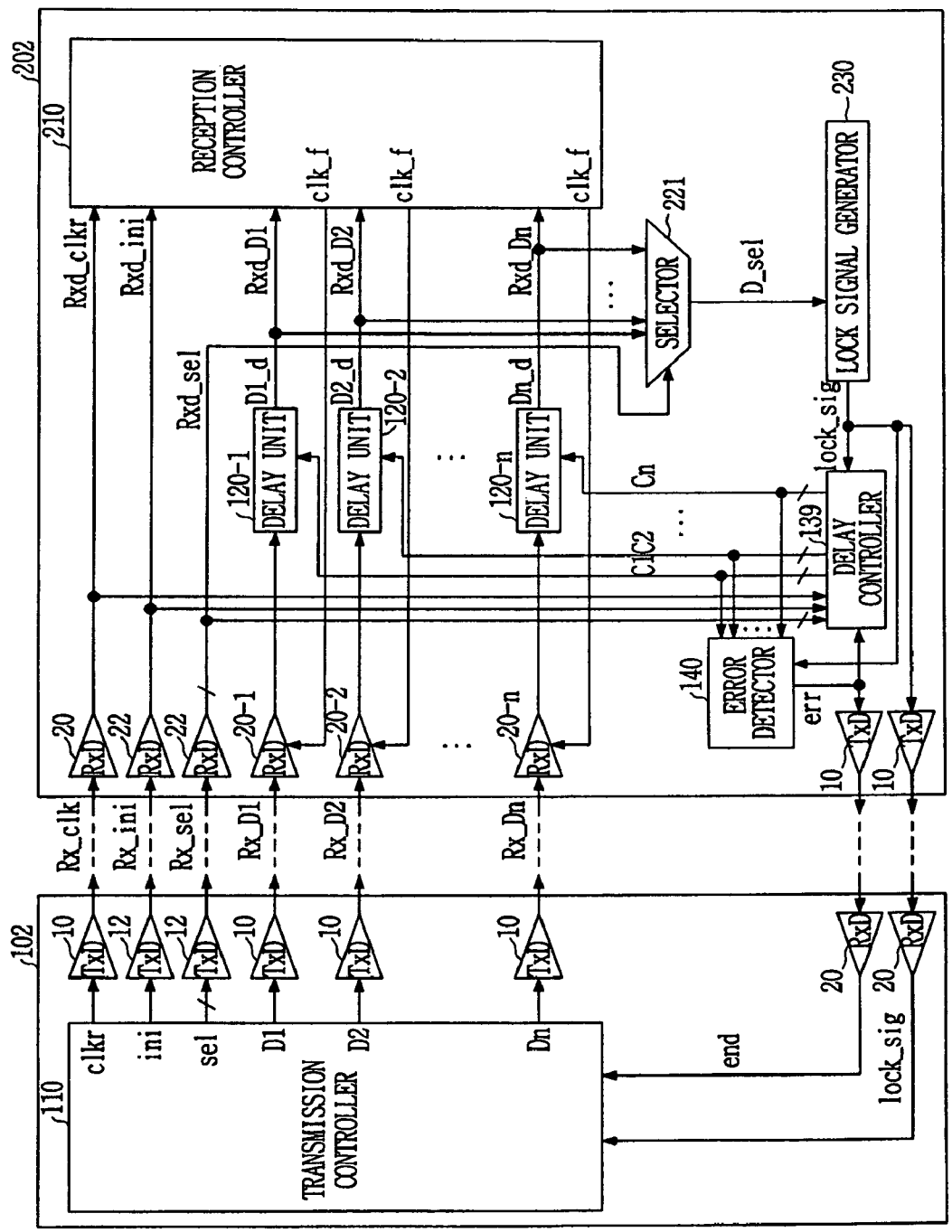
FIG. 5 illustrates a block diagram of a configuration of a data transceiver system according to other example embodiments.

FIG. 5 illustrates a block diagram of a data transceiver system according to other example embodiments. The data transceiver system may include a data transmitter 102 and a data receiver 202. The data transmitter 102 may include the transmission controller 110, the plurality of output drivers 10 and 12, and the input driver 20. The data receiver 202 may include the reception controller 210, the plurality of delay units 120-1~120-n, the selector 220, the lock signal generator 230, a delay controller 139, the error detector 140, the plurality of input drivers 20, 20-1~20-n, and 22, and output drivers 10. The plurality of delay units 120-1~120-n, the delay controller 139, and the error detector 140 may form an error corrector.

The functions and operations of the transmission controller 110, the reception controller 210, the lock signal generator 230, the delay units 120-1~120-n, the output drivers 10 and 12, and the input drivers 20, 20-1~20-n, and 22 are the same as described with reference to FIG. 2. The function and operation of the error detector 140 are the same as described with reference to FIGS. 2 and 3.

The delay controller 139 may set initial values of a plurality of delay codes C1~Cn to a predetermined value in response to an input initialization signal Rxd_ini and a lock signal lock_sig, re-set the initial values of the delay codes C1~Cn to a value that is different from the predetermined value in response to an error signal err and the lock signal lock_sig output from the error detector 140, and vary each of the delay codes C1~Cn in response to the lock signal lock_sig and an input clock signal Rxd_clk. The delay controller 139 may receive the input initialization signal Rxd_ini and an input reference clock signal Rxd_clkr in place of the initialization signal ini and the reference clock signal clkr of FIG. 4. A configuration of the delay controller 139 may be the same as that of the delay controller 132 of FIG. 4. In response to an input selection signal Rxd_sel, the selector 221 may select one of delayed data signals D1_d~Dn_d output from the delay units 120-1~120-n and outputs the selected data signal D_sel.

In other words, the data transceiver system shown in FIG. 5 may be the same as that shown in FIG. 2, except that an error corrector, i.e., the delay units 120-1~120-n, the delay controller 139, and the error determiner 140, may be included in the data receiver 202.

Although not shown in FIG. 5, the error signal err output from the error determiner 140 may be input to the reception controller 210 and the data frame lock process may be repeated by delaying or advancing the frame clock signal clk_f by a predetermined time in the reception controller 210 when an error has occurred in the data frame lock process.

Figure 6A:
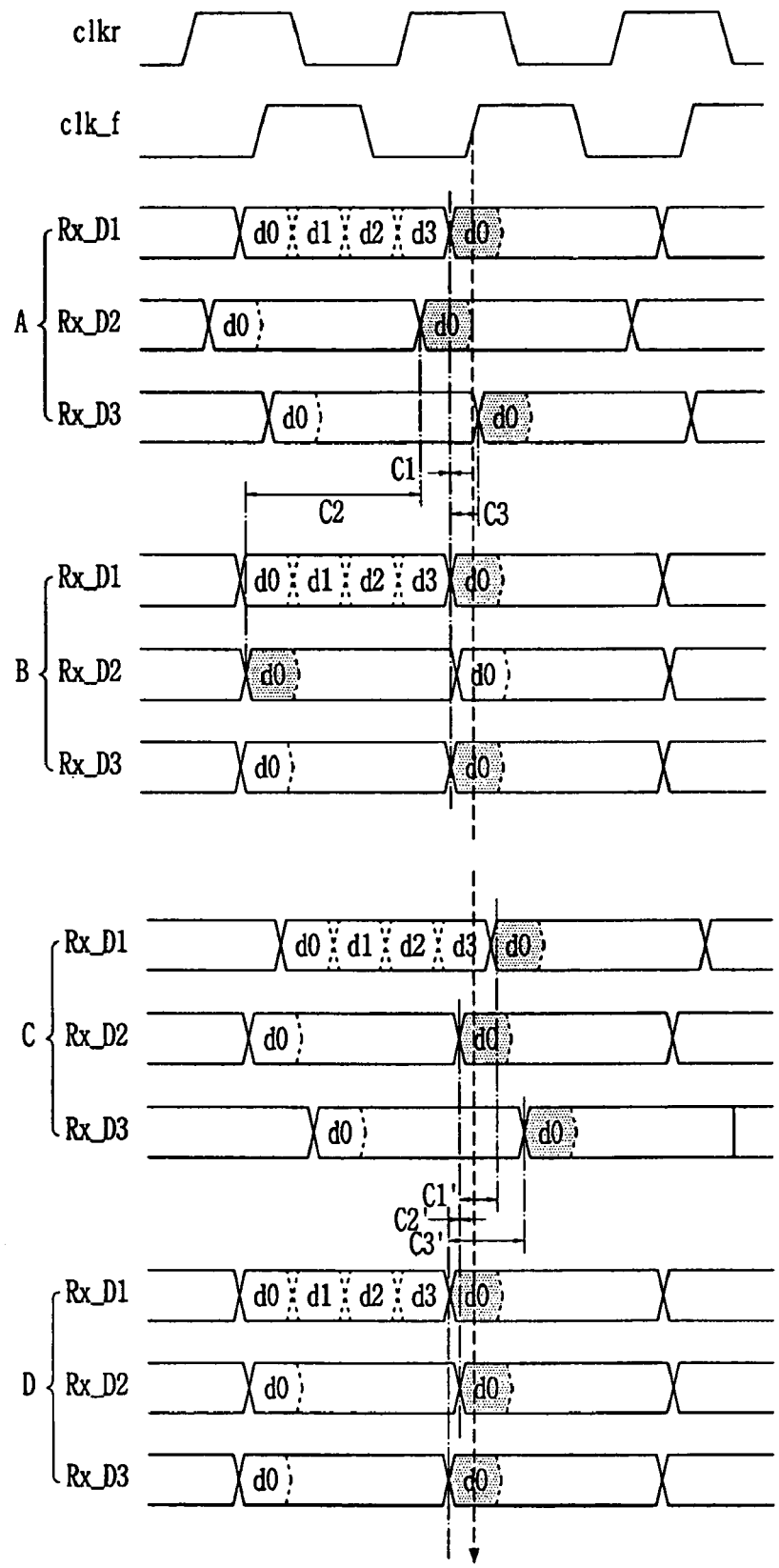
FIGS. 6A to 6C illustrate timing diagrams of a method of sensing and correcting an error in a data frame lock process in the data transceiver system according to example embodiments.
Figure 6B:
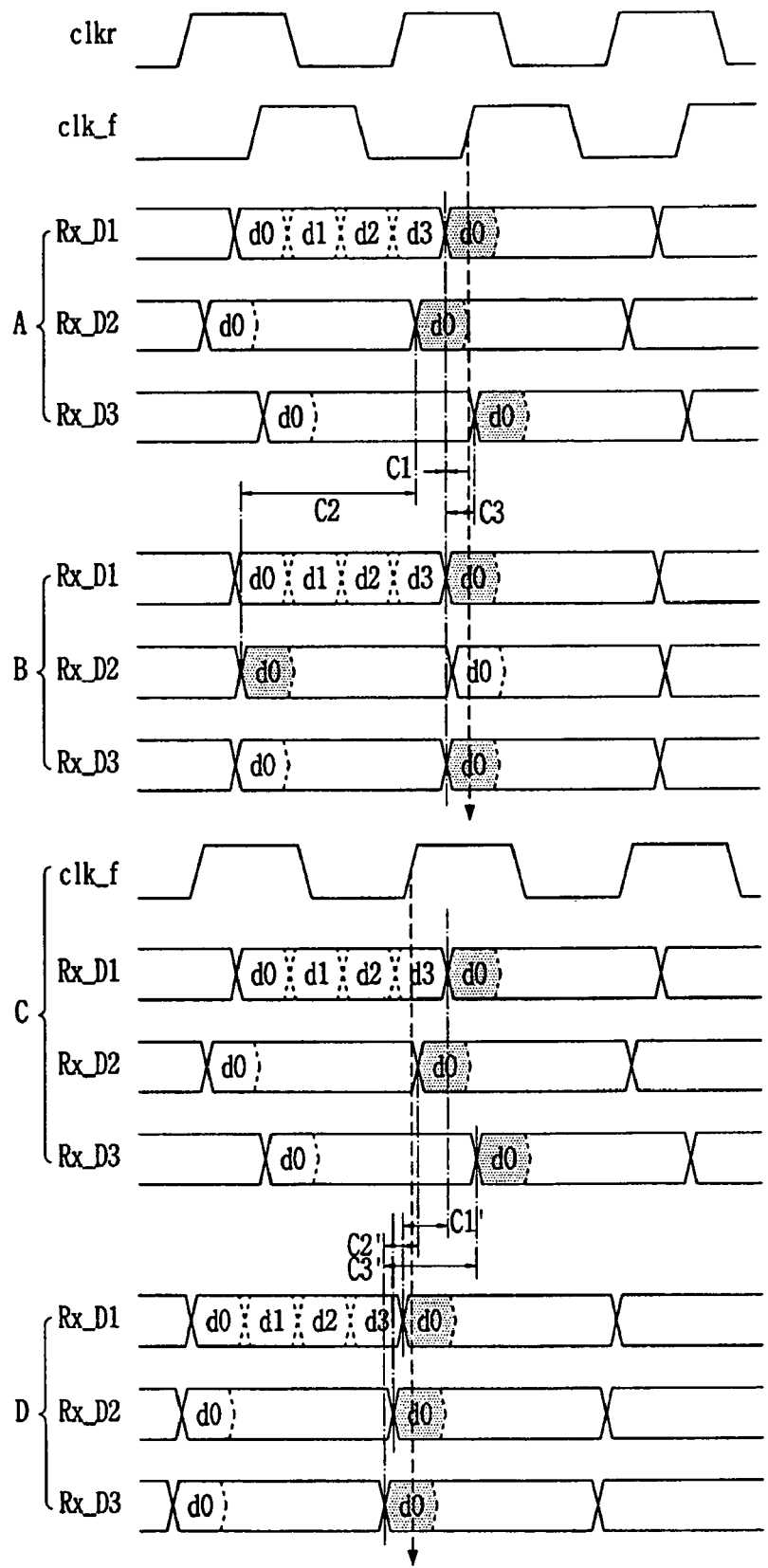
Figure 6C:
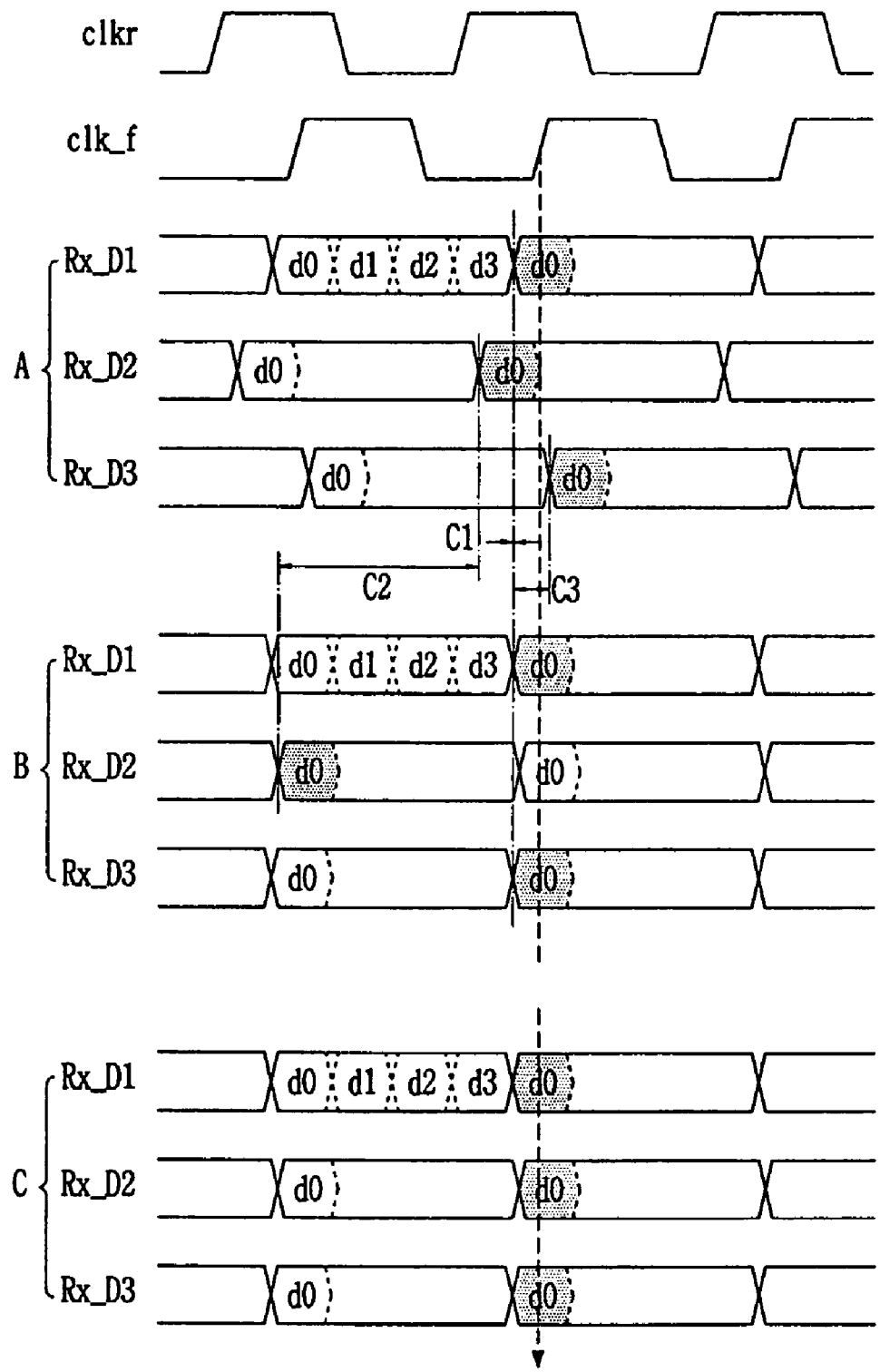

FIGS. 6A to 6C illustrate timing diagrams of a method of sensing and correcting an error in a data frame lock process in the data transceiver system according to example embodiments. In the particular example illustrated therein, there are three data signals output from the transmission controller 110. In FIGS. 6A to 6C, A denotes a state before the data frame lock process and B denotes a state after the data frame process in which an error has occurred. In FIGS. 6A and 6B, C denotes a state in which an initial value has been changed when the error has occurred in the data frame lock process and D denotes a state in which the error has been corrected by changing the initial value and repeating the data frame lock process. In FIG. 6C, C denotes a state in which the error that occurred in the data frame lock process has been corrected by changing only a specific register value. In FIGS. 6A to 6C, clkr denotes a reference clock signal output from the transmission controller 110, clk_f denotes a frame clock signal output from the reception controller 210, and Rx_D1~Rx_Dn denote reception data signals input to the input drivers 20-1~20-n of the data receiver 201 or 202.

Since the transmission controller 110 of the data transmitter 101 or 102 outputs data signals in one data frame in the normal operation as described above, the reception data signals Rx_D1~Rx_D3 input to the input drivers of the data receiver 200 configure one data frame. For example, in the reception data signals Rx_D1~Rx_D3, d0 is a command signal and d1, d2, and d3 are address signals. Alternatively, in the reception data signals Rx_D1~Rx_D3, d0 is a command signal, d1 and a portion of d2 are address signals, and the remaining portion of d2 and d3 are write data. The reception data signals Rx_D1~Rx_Dn may be variously configured in one data frame.

A method of sensing and correcting an error in a data frame lock process in the data transceiver system according to example embodiments will be described with reference to FIGS. 6A to 6C and FIGS. 2 to 5. In other words, the processes discussed below may be employed regardless of the location of delay units 120-1~120-n, the delay controller 132, and the error detector 140. For the sake of illustration, a reference value for determining whether or not an error has occurred may be set to 2 unit intervals (UI).

First, FIG. 6A shows an example in which the delay controller 132 or 139 corrects an error by resetting an initial value of a code cd output from the counter 136 when the error has occurred in the data frame lock process to a value different from a predetermined value.

The reference clock signal clkr and the initialization signal ini output from the transmission controller 110 may be input to the reception controller 210 via the output drivers 10 and 12 and the input drivers 20 and 22, respectively. After the initialization signal ini is activated in the data frame lock operation, the transmission controller 110 may output the data signals D1~D3 having the predetermined pattern. For example, the data signals D1~D3 may be output such that d0 of each of the input data signals Rx_D1~Rx_D3 has a logic value "1" and d1, d2, and d3 have a logic value "0". The transmission controller 110 may output the selection signal sel to control the selector 220 or 221 of the data receiver 201 or 202 to output the input data signal Rxd_D1 as the selected data signal D_sel.

In response to the input initialization signal Rxd_ini driven by the input driver 22, the reception controller 210 may output the frame clock signals clk_f having a given period using the input reference clock signal Rxd_clkr driven by the input driver 20.

The data signals D1~Dn output from the transmission controller 110 of the data transmitter 101 may be delayed by the given time by the delay units 120-1~120-n and output to the data receiver 201 via the output drivers 10. The reception data signals Rx_D1~Rx_Dn input to the data receiver 201 may be driven by the input drivers 20-1~20-n. At this time, the input drivers 20-1~20-n may drive the reception data signals Rx_D1~Rx_Dn input at rising edges of the frame clock signals clk_f output from the reception controller 210 and may output the input data signals Rxd_D1~Rxd_Dn.

In response to the input selection signal Rxd_sel, the selector 220 or 221 may select the input data signal Rxd_D1 and output the selected data signal D_sel. The lock signal generator 230 may receive the selected data signal D_sel and activate the lock signal lock_sig upon determining that the input data signal Rxd_D1 has been locked. As described above, the lock signal generator 230 may be configured with the plurality of determination circuits (voters), etc. For example, when the transmission controller 110 outputs a signal in which only d0 is "1" and the others are "0", among the reception data signals Rx_D1~Rx_D3, the lock signal generator 230 may determine that the data frame has not been locked when a large number of continuously input, selected data signals D_sel are "0", and output the low-level lock signal lock_sig. On the other hand, when a large number of selected data signals D_sel are "1", the lock signal generator 230 may determine that the data frame has been locked and output the high-level lock signal lock_sig. When the lock signal lock_sig has the high level, the transmission controller 110 may output the selection signal sel to control the selector 220 or 221 to select the input data signal Rxd_D2.

The delay controller 132 (or 139) may vary a delay time of the data signal D1 (or the outputs of the input drivers 20-1~20-n) by varying a delay code C1 while the lock signal lock_sig is maintained at the low level. When the lock signal lock_sig has the high level, the delay controller 132 (or 139) may fix the delay code C1 and vary a delay code C2 until the lock signal lock_sig has the high level again. After this process is repeated, the delay controller 132 (or 139) may determine that the data frame lock process has ended when the lock signal lock_sig has been activated three times and may activate the lock end signal lock_end.

In other words, the data input/output system shown in FIGS. 2 and 5 may start the data frame lock process when the initialization signal ini is activated. The transmission controller 110 may output each of the reception data signals Rx_D1~Rx_Dn in which d0 is "1" and d1, d2, and d3 are "0". Then, the lock signal generator 230 may output the low-level lock signal lock_sig upon determining that the reception data signal Rx_D1 is "0" at the rising edge of the frame clock signal clk_f. When the reception data signal Rx_D1 is "1", the high-level lock signal lock_sig is output. When the lock signal lock_sig has the low level, the delay controller 132 (or 139) may vary the delay code C1 such that the reception data signal Rx_D1 (or the input data signal Rxd_D1) is shifted to the left, i.e., the reception data signal Rx_D1 is advanced by a predetermined time. The delay controller 132 (or 139) may vary delay codes to delay reception data signals by a predetermined time. When the lock signal lock_sig has the high level, the selector 220 may select and output the input data signal Rxd_D2. The lock signal generator 230 and the delay controller 132 (or 139) may repeat the above process for the reception data signals Rx_D2~Rx_Dn. In this process, each of the reception data signals Rx_D1~Rx_D3 indicated by A of FIG. 6A may be adjusted such that d0 is in synchronization with the rising edge of the frame clock signal clk_f. Through the data bit lock process, the reception data signals Rx_D1~Rx_D3 may be more precisely adjusted.

However, when d0 of the reception data signal Rx_D2, which is different from other reception data signals, is earlier than the rising edge of the frame clock signal clk_f, as indicated by A of FIG. 6A, and undergoes the above-described data frame lock process, only the reception data signal Rx_D2 is advanced by one frame as indicated by B of FIG. 6A, thereby generating an error. In this case, the reception data frame (Rx_D1~Rx_D3) received by the data receiver 201 or 202 is different from the data frame (D1~D3) output from the data transmitter 101 or 102. For example, when a first data frame is a command signal and an address signal, and a second data frame is a write data signal, d0~d3, with respect to the rising edges of the frame clock signals clk_f1 the reception data signals Rx_D1 and Rx_D3 are command and address signals, but the reception data signal Rx_D2 is a data signal. Consequently, an error occurs in the data frame lock process and a desired operation may not be performed.

In this case, when the data frame lock process is performed, delay codes C1, C2, and C3 are about 0 UI, 3.5 UI, and 0.5 UI, respectively. The subtraction unit 141 of the error detector 140 may calculate difference values DV1, DV2, and DV3 between the delay codes C1, C2, and C3 output from the delay controller 132 (or 139). In the particular example illustrated, a largest difference value is (C2−C1), here, about 3.5 UI. A comparison result signal R1 output from the comparator 142-1 has a logic value "1". Consequently, the error signal err has the high level, indicating that an error has occurred in the data frame lock process.

In FIG. 6A, C denotes a state before the data frame lock process after the initial value setting unit 135 of the delay controller 132 (or 139) resets the initial value.

When the high-level error signal err is input, the initial value setting unit 135 of the delay controller 132 newly sets the initial value of the code cd output from the counter 136. That is, the initial value of the code cd is that of each of the delay codes C1~Cn. Since the initial value of each of the delay codes C1~Cn changes when the initial value of the code cd is changed, delay times of the delay units 120-1~120-n also change. Accordingly, the state shown in C of FIG. 6A is taken when the reception data signals Rx_D1~Rx_Dn are delayed by a longer predetermined time (equal to or longer than about 1 UI) than the delay indicated by A of FIG. 6A.

In FIG. 6A, D denotes a state in which the data frame lock process has been repeated using the reset initial value.

When the data frame lock process is performed according to the same method as described above, delay codes C1', C2', and C3' are newly set such that d0 of the reception data signals Rx_D1~Rx_Dn is placed at the rising edge of the frame clock clk_f.

Next, the error detector 140 may determine whether an error has occurred in the data frame lock process by the same method as described above, i.e., using difference values between the delay codes C1', C2', and C3'. Referring to D of FIG. 6A, C1', C2', and C3' correspond to 0.5 UI, 0 UI, and 1.5 UI, and all the difference values are smaller than the reference value of 2 UI. Accordingly, all the comparison result signals R1~Rn output from the comparison unit 142 of the error detector 140 may be "0". The error signal generator 143 may output the low-level error signal err, thus ending the data frame lock operation ends when no error has occurred. Consequently, any errors occurring in the data frame lock process may be corrected.

Next, FIG. 6B shows an example of correcting an error by delaying or advancing the frame clock signal clk_f by a predetermined time when the error has occurred in the data frame lock process.

Timing diagrams A and B of FIG. 6B are the same as those of FIG. 6A. A process of determining whether an error has occurred in the data frame lock process is the same as described with reference to FIG. 6A. That is, the error detector 140 outputs the high-level error signal err when the error has occurred in the data frame lock process.

In FIG. 6B, C denotes a state in which the frame clock signal clk_f has been advanced by the predetermined time. That is, when the high-level error signal err output from the error detector 140 is input from the reception controller 210, the reception controller 210 may advance the frame clock signal clk_f to be output by the predetermined time.

In FIG. 6B, D denotes a state in which the data frame lock process has been reperformed after advancing the frame clock signal clk_f by the predetermined time.

Referring to D of FIG. 6B, the delay codes C1', C2', and C3' output from the delay controller 132 (or 139) are about 1 UI, 0.5 UI, and 2 UI, respectively, when the data frame lock process has been performed by advancing the frame clock signal clk_f by the predetermined time. Since all difference values between the delay codes C1', C2', and C3' are smaller than the reference value of 2 UI, the error detector 140 outputs the low-level error signal err. That is, the data frame lock operation ends by determining that no error has occurred in the data frame lock process. Accordingly, any errors occurring in the data frame lock process can be corrected.

Next, FIG. 6C shows an example of correcting an error by delaying an earliest reception data signal of the reception data signals by one frame when the error has occurred in the data frame lock process.

Timing diagrams A and B of FIG. 6C are the same as those of FIG. 6A. A process of determining whether an error has occurred in the data frame lock process is the same as described with reference to FIG. 6A. That is, the error detector 140 outputs the high-level error signal err when an error has occurred in the data frame lock process.

In FIG. 6C, C denotes a state in which only the earliest reception data signal of the reception data signals has been delayed by one frame.

A delay code determining a delay time of the earliest reception data signal of the reception data signals is larger than the other delay codes. Accordingly, when the error detector 140 outputs the high-level error signal err, the delay controller 132 (or 139) may detect a largest delay code value of the delay codes C1~C3 and decrease the detected delay code value by the predetermined value. Referring to FIG. 6C, the earliest reception data signal is Rx_D2 and the delay code C2 determining a delay time of the reception data signal Rx_D2 has the largest value. In this case, the delay controller 132 (or 139) may change a value stored in the register 133-2 such that the reception data signal Rx_D2 may be delayed by one frame. As described above, the delay controller 132 (or 139) may receive and analyze the signals R1~Rn or D1~Dn, other than the error signal err from the error detector 140, and determine the earliest reception data signal. The delay controller 132 (or 139) may determine the earliest reception data signal using a method of detecting a delay code having the largest value, e.g., C2 in FIG. 6C, by directly comparing the delay codes C1~Cn stored in the registers 133-1~133-n.

As shown in C of FIG. 6C, d0 of all the reception data signals Rx_D1~Rx_Dn may be placed at the rising edge of the frame clock signal clk_f when only the earliest reception data signal Rx_D2 is delayed by one frame. Accordingly, the data frame lock process may end immediately without performing an additional data frame lock process.

When the data frame lock process ends, the data transceiver system may determine whether an error has occurred in the data frame lock process by calculating difference values between the delay codes C1~Cn respectively output from the delay controller 132 or 139 to the delay units 120-1~120-n and comparing the difference values with a predetermined value. As described above, the reference value may differ according to the number of data in one frame, and may be experimentally determined for a particular data transceiver system.

When an error has occurred in the data frame lock process, i.e., when any one of the difference values is larger than a reference value, the error that occurred in the data frame lock process may be corrected. Such correction may be realized by repeating the data frame lock process after resetting the initial values of the delay codes C1~Cn, after advancing (or delaying) the frame clock signal clk_f by a predetermined time, or after changing only a delay code for determining a delay time of the earliest data signal such that the data signal is delayed by about one frame.

According to example embodiments, a data transceiver system may include an error corrector that may sense and correct an error in a data frame lock process. The error corrector may be included in the transmitter and/or in the receiver.

Exemplary embodiments of the present invention have been disclosed herein, and although specific terms are employed, they are used and are to be interpreted in a generic and descriptive sense only and not for purpose of limitation. For example, the processing of embodiments may be implemented in software, e.g., by an article of manufacture having a machine-accessible medium including data that, when accessed by a machine, cause the machine to correct errors occurring in a data frame lock process in a transceiver system. Accordingly, it will be understood by those of ordinary skill in the art that various changes in form and details may be made without departing from the spirit and scope of the present invention as set forth in the following claims.

What is claimed is:

1. A data transceiver system, comprising:
   a data transmitter configured to output a reference clock signal and a plurality of data signals; and
   a data receiver configured to receive the reference clock signal and the plurality of data signals, determine whether a data frame has been locked, and output a lock signal according to the determination in a data frame lock operation,
   wherein one of the data transmitter and the data receiver comprises
   a plurality of delay units, each delay unit configured to delay a corresponding data signal among the plurality of data signals by a time in response to a corresponding delay code among a plurality of delay codes and to output the delayed data signal;
   an error detector configured to receive the plurality of delay codes, determine whether an error has occurred, and output an error signal according to the determination in the data frame lock operation; and
   a delay controller configured to set initial values of the plurality of delay codes to a predetermined value, vary and output each of the plurality of delay codes in response to the lock signal, and vary and output at least one of the plurality of delay codes in response to the error signal in the data frame lock operation.

2. The data transceiver system as claimed in claim 1, wherein the data transmitter outputs the plurality of data signals in the data frame.

3. The data transceiver system as claimed in claim 1, wherein the error detector includes:
   a subtraction unit configured to calculate and output difference values between the plurality of delay codes;
   a comparison unit configured to output comparison results by comparing each of the difference values with a predetermined reference value; and
   an error signal generator configured to receive the comparison results and output the error signal.

4. The data transceiver system as claimed in claim 3, wherein the data transmitter is configured to output a selection signal in response to the lock signal.

5. The data transceiver system as claimed in claim 4, wherein the data receiver includes:
   a reception controller configured to receive the reference clock signal and output a frame clock signal in the data frame lock operation;
   a plurality of input drivers, each input driver configured to receive a corresponding delayed data signal among the plurality of delayed data signals in response to the frame clock signal and outputting an input data signal;
   a selector configured to select one of the input data signals in response to the selection signal and output the selected data signal; and
   a lock signal generator configured to receive the selected data signal, determine whether a data frame has been locked, and output the lock signal.

6. The data transceiver system as claimed in claim 4, wherein the data receiver includes:
   a reception controller configured to receive the reference clock signal and output a frame clock signal in the data frame lock operation;
   a plurality of input drivers, each input driver configured to receive a corresponding data signal among the plurality of data signals in response to the frame clock signal and outputting an input data signal to the corresponding delay unit among the plurality of delay units;
   a selector configured to select one of the delayed data signals in response to the selection signal and output the selected data signal; and
   a lock signal generator configured to receive the selected data signal, determine whether a data frame has been locked, and output the lock signal.

7. The data transceiver system as claimed in claim 4, wherein the delay controller includes:
   a counter configured to vary and output a code on the basis of an initial value until the lock signal is activated;
   a plurality of registers, each register configured to receive and store the code as one of the plurality of delay codes and to output the stored delay code;
   a register selector configured to output the code to one of the plurality of registers in response to the selection signal; and
   a setting unit configured to set an initial value of the counter to the predetermined value in response to the lock signal and set the initial value of the counter to the value that is different from the predetermined value in response to the error signal and the lock signal in the data frame lock operation.

8. The data transceiver system as claimed in claim 6, wherein the delay controller further includes a count clock generator configured to receive the reference clock signal and generate a count clock signal, and the counter varies the code in response to the count clock signal.

9. The data transceiver system as claimed in claim 4, wherein the delay controller includes:
   a counter configured to vary and output a code on the basis of an initial value until the lock signal is activated;
   a plurality of registers, each register configured to receive and store the code as one of the plurality of delay codes and to output the stored delay code;
   a register selector configured to output the code to one of the plurality of registers in response to the selection signal; and
   a setting unit configured to set an initial value of the counter to the predetermined value in response to the lock signal and decrement only a delay code stored in a register storing a largest delay code value among the plurality of registers, by a predetermined value, in response to the error signal in the data frame lock operation.

10. The data transceiver system as claimed in claim 9, wherein the setting unit is configured to receive the comparison results output from the comparison unit of the error detector and detect the register storing the largest delay code value.

11. The data transceiver system as claimed in claim 9, wherein the setting unit is configured to receive the difference values output from the subtraction unit of the error detector and detect the register storing the largest delay code value.

12. The data transceiver system as claimed in claim 9, wherein the setting unit is configured to receive the plurality of delay codes stored in the plurality of registers and detect the register storing the largest delay code value.

13. The data transceiver system as claimed in claim 4, wherein the data receiver includes:
   a reception controller configured to receive the reference clock signal and output a frame clock signal in the data frame lock operation, and wherein the delay controller includes:
   a counter configured to vary and output a code on the basis of an initial value until the lock signal is activated;
   a plurality of registers, each register configured to receive and store the code as one of the plurality of delay codes and to output the stored delay code;

a register selector configured to output the code to one of the plurality of registers in response to the selection signal; and a setting unit configured to set an initial value of the counter to the predetermined value in response to the lock signal in the data frame lock operation, and wherein the reception controller outputs the frame clock signal advanced by a predetermined time in response to the error signal.

14. The data transceiver system as claimed in claim 13, wherein the delay controller further includes a count clock generator configured to receive the reference clock signal and generate a count clock signal, and the counter varies the code in response to the count clock signal.

15. The data transceiver system as claimed in claim 1, wherein the data transmitter is a memory controller and the data receiver is a semiconductor memory device.

16. A method of correcting an error in transmission and reception of a plurality of data signals, the method comprising:

setting initial values of a plurality of delay codes to a predetermined value;

varying and outputting each of the plurality of delay codes based on the initial value in response to a lock signal;

delaying a corresponding data signal among the plurality of data signals by a time in response to a corresponding delay code among the plurality of delay codes and outputting the delayed data signal;

determining from the plurality of delay codes whether an error has occurred and outputting an error signal according to the determination in a data frame lock operation; and resetting at least one of the plurality of delay codes in response to the error signal in the data frame lock operation.

17. The method as claimed in claim 16, wherein determining whether an error has occurred and outputting an error signal comprises:

calculating and outputting difference values between the plurality of delay codes;

outputting comparison results by comparing each of the difference values with a predetermined reference value; and receiving the comparison results and outputting the error signal.

18. The method as claimed in claim 16, wherein resetting at least one of the plurality of delay codes comprises:

setting the initial value of the plurality of delay codes to the value that is different from the predetermined value in response to the error signal and the lock signal in the data frame lock operation; and varying and outputting each of the plurality of delay codes based on the initial value that is different from the predetermined value in response to a lock signal.

19. The method as claimed in claim 16, wherein resetting at least one of the plurality of delay codes comprises:

decrementing only a largest delay code among the plurality of varied delay codes, by a predetermined value, in response to the error signal in the data frame lock operation.

20. The method as claimed in claim 16, wherein the method further comprises receiving the plurality of data signals in response to a frame clock signal, and wherein resetting at least one of the plurality of delay codes comprises:

advancing the frame clock signal by a predetermined time in response to the error signal; and varying and outputting again each of the plurality of delay codes based on the initial value in response to a lock signal.

* * * * *